United States Patent [19]
Ono et al.

[11] Patent Number: 5,138,203
[45] Date of Patent: Aug. 11, 1992

[54] INTEGRATED CIRCUIT COMPENSATION FOR LOSSES IN SIGNAL LINES DUE TO PARASITICS

[75] Inventors: Koichi Ono, Tokyo; Masao Hotta, Hanno; Yoshito Nejime, Hachioji, all of Japan

[73] Assignee: Hitachi, Ltd., Tokyo, Japan

[21] Appl. No.: 342,328

[22] Filed: Apr. 24, 1989

[30] Foreign Application Priority Data

Apr. 27, 1988 [JP] Japan ................................ 63-104633

[51] Int. Cl.[5] .................... H03K 17/687; H03K 17/16
[52] U.S. Cl. .................................. 307/572; 307/443; 307/303
[58] Field of Search ............... 307/443, 303, 572, 557, 307/146, 89; 357/45; 338/327, 180

[56] References Cited

U.S. PATENT DOCUMENTS

| | | | |
|---|---|---|---|
| 4,473,798 | 9/1984 | Cedrone et al. | 307/89 |
| 4,564,817 | 1/1986 | Gilson et al. | 330/286 |
| 4,616,146 | 10/1986 | Lee et al. | 307/443 |
| 4,629,909 | 12/1986 | Cameron | 307/443 |
| 4,649,294 | 3/1987 | McLaughlin | 307/443 |
| 4,649,295 | 3/1987 | McLaughlin | 307/443 |
| 4,675,552 | 6/1987 | Wood | 307/443 |
| 4,682,054 | 7/1987 | McLaughlin | 307/443 |
| 4,879,480 | 11/1989 | Suzuki et al. | 307/303 |

OTHER PUBLICATIONS

"A Monolithic 8-Bit A/D Converter With 120 Mhz Conversion Rate" by Inoue et al. IEEE JSSC, vol. Sc19, No. 6, Dec. 1984.

The ARRL Antenna Book, The American Radio Relay League, Inc., 1974, pp. 70–71.

*Primary Examiner*—Edward P. Westin
*Assistant Examiner*—Richard Roseen
*Attorney, Agent, or Firm*—Antonelli, Terry, Stout & Kraus

[57] ABSTRACT

An integrated circuit including a plurality of circuits having the same input impedance, arranged at regular intervals, and applied with a signal from a single signal source, is disclosed in which the input impedance is substantially capacitive, the characteristic impedance of a signal line connected to the signal source for sending the signal to the circuits is given by $Z_0 \sqrt{L/C}$, where L indicates the inductance of the signal line per one circuit, and C indicates the combined capacitance of the parasitic capacitance of the signal line per one circuit and the input capacitance of each circuit, the signal line is terminated by a circuit element having impedance equal to the characteristic impedance $Z_0$, and the signal source has output impedance equal to the characteristic impedance $Z_0$.

21 Claims, 6 Drawing Sheets

INTEGRATED CIRCUIT COMPENSATION FOR LOSSES IN SIGNAL LINES DUE TO PARASITICS

BACKGROUND OF THE INVENTION

The present invention relates to an integrated circuit, and more particularly to an integrated circuit for supplying a favorable signal to a group of circuits having the same input impedance.

For example, a flash analog-digital converter includes a plurality of circuits having the same input impedance. In a case where the flash analog-digital converter has an 8-bit digital output, $2^8$ resistors are connected in series, to obtain $2^8$ reference voltage levels. When an input signal having a voltage level is applied to the analog-digital converter, $2^8$ reference voltage levels are simulaneously compared with the input signal by $2^8$ comparators. When an input signal having a voltage level of 0 V is applied to the analog-digital converter, the outputs of all the comparators are put to a low level. Now, let us consider a case where the maximum value of the reference voltage levels is 8 V, and an input signal having a voltage level of 5.05 V is applied to the analog-digital converter. In this case, the outputs of comparators corresponding to reference voltage levels lower than 5.05 V are all put to a high level, and the outputs of comparators corresponding to reference voltage levels greater than 5.05 V are all put to the low level. Further, two adjacent comparators are selected from $2^8$ comparators so that the output of one of the adjacent comparators takes the high level and the output of the other comparator takes the low level, to convert the input signal into a binary code with the aid of an encoder.

In such a flash analog-digital converter, a clock signal is applied to each comparator in the form of a differential input for the NPN transistors shown in FIG. 6, and each NPN transistor has input capacitance $C_i$.

Further, there are the inductance and capacitance due to a wiring pattern from a clock driver to the comparators. Thus, as shown in FIG. 7, an LC circuit which is an equivalent circuit, is formed between the clock driver and the input part of each comparator. Accordingly, ringing is generated in a clock signal applied to each comparator, on the basis of parasitic impedance of the LC circuit. The ringing generates a conversion error.

In order to prevent such ringing, for example, a compensation method has been used which utilizes a resistor 30 as shown in FIG. 5, (Technical Report of the Institute of Electronics, Information and Communication Engineers of Japan, Vol. 84, No. 11, SSD84-12, pages 79 through 86).

According to the above method, as shown in FIG. 5, $2^8$ comparators applied with reference voltage levels of 1 to $2^8$ are arranged in two columns, and a resistor 30 is connected between output terminals of a clock driver 20 for sending out a complementary signal, to weaken the overshoot generated between the output terminals, thereby reducing ringing due to the overshoot.

Indeed the circuit of FIG. 5 pays attention to the reduction of ringing at the terminals for delivering the clock signal, but the circuit pays no attention to the waveform of the clock signal at the input terminal of each comparator. Hence, when a high-speed clock signal is applied to the LC circuit of FIG. 7, ringing is still generated in the clock signal applied to the input terminal of each comparator. Thus, the conversion error of analog digital converter is increased.

SUMMARY OF THE INVENTION

It is an object of the present invention to provide an integrated circuit, in which a plurality of circuits having the same input impedance are arranged, wherein a signal from a single signal source can be applied to each of the circuits without generating ringing.

In order to attain the above object, according to an aspect of the present invention, there is provided an integrated circuit including a plurality of circuits having the same input impedance, arranged at regular intervals, and applied with a signal from a single signal source, which integrated circuit comprising: a signal line connected to the signal source for sending the signal to the circuits, the characteristic impedance of the signal line being given by $Z_0 = \sqrt{L/C}$ where L indicates the inductance of the signal line per one circuit, and C indicates the combined capacitance of the parasitic capacitance of the signal line per one circuit and the input capacitance of each circuit substantially representative of the input impedance of each circuit; and means having an impedance equal to the characteristic impedance $Z_0$ for terminating the signal line wherein an output impedance of the signal source is selected to be equal to the characteristic impedance $Z_0$.

According to another aspect of the present invention, there is provided an integrated circuit, in which a plurality of circuits having the same input impedance are divided into a plurality of circuit groups, and signal lines for the circuits groups are connected with each other, to be terminated by a common resistor serving as the terminating means.

According to a further aspect of the present invention, there is provided an integrated circuit, in which a complementary signal from a single signal source is applied to a plurality of circuits having the same input impedance through a pair of signal lines, and a resistor serving as the terminating means is connected between the signal lines.

As mentioned above, according to the present invention, a signal source has output impedance equal to the characteristic impedance of a signal line, and the signal line connected to the signal source is terminated by a resistor having a resistance equal to the characteristic impedance. Thus, the waveform of an input signal applied to each circuit is prevented from being degraded, and a plurality of circuits, each applied with the input signal, can operate normally.

In the LC circuit of FIG. 7, reference character L designates the inductance of a clock line connected between adjacent comparators, and C the combined capacitance of the input capacitance of one comparator and the parasitic capacitance of a clock line connected between adjacent comparators. The inductance L and the capacitance C are regarded as unit inductance and unit capacitance, respectively, and the impedance $Z_0 = \sqrt{L/C}$ determined from the above inductance and capacitance is regarded as the characteristic impedance of the clock line.

As is well known, when a signal line having a characteristic impedance $Z_0$ is terminated by an element having its impedance equal to the characteristic impedance $Z_0$, the signal line can transmit a signal normally. Accordingly, when a resistor having resistance equal to the characteristic impedance $Z_0$ determined from the inductance L and the capacitance C is provided on the output side of the clock driver to attain impedance matching, and the clock line from the clock driver is terminated by an element having an impedance equal to the characteristic impedance $Z_0$, a clock signal having no ringing will be applied to each comparator.

DESCRIPTION OF THE PREFERRED EMBODIMENTS

Embodiments of the present invention will be explained below in detail, with reference to the drawings.

Figure 1:
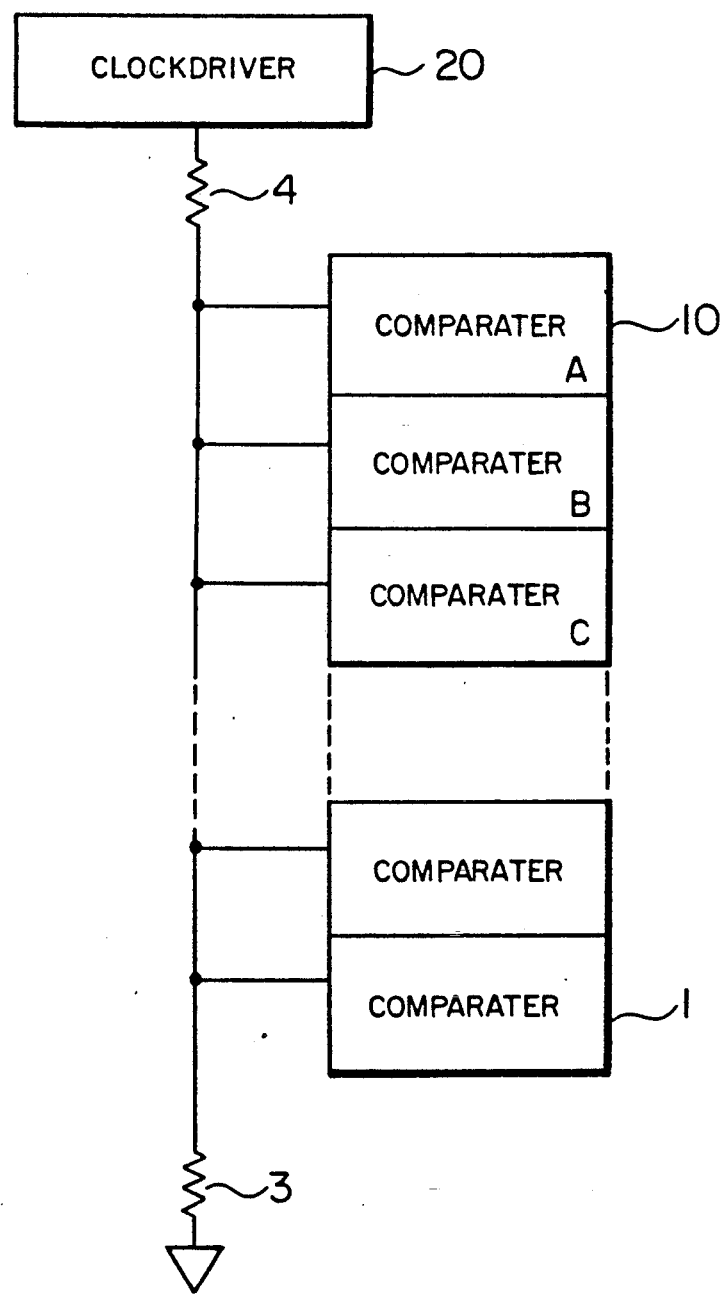
FIG. 1 is a block diagram showing an embodiment of a flash analog-digital converter according to the present invention.

FIG. 1 shows an embodiment of a flash analog-digital converter according to the present invention. Referring to FIG. 1, a clock line connected to a clock driver 20 for driving a comparator group 1 is terminated by a resistor 3. The comparator group 1 includes a plurality of comparators 10, which are arranged on an integrated circuit chip at regular intervals. Hence, the combined capacitance C of the wire capacitance of the clock line per one comparator and the input capacitance of each comparator, and the inductance L of the clock line per one comparator can be readily estimated. The characteristic impedance $Z_0$ of the clock line is given by an equation $Z_0 = \sqrt{L/C}$. That is, the characteristic impedance $Z_0$ is determined from the capacitance C and the inductance L. When the output impedance of the clock driver 20 is made equal to the characteristic impedance $Z_0$ with the aid of a resistor 4, and a terminating resistor 3 has resistance equal to the characteristic impedance $Z_0$, the clock line can supply a clock signal stably to each comparator without generating ringing in the clock signal, for the same reason that a signal line having the above features can show an excellent transmission characteristic in an ordinary transmission system.

Figure 2:
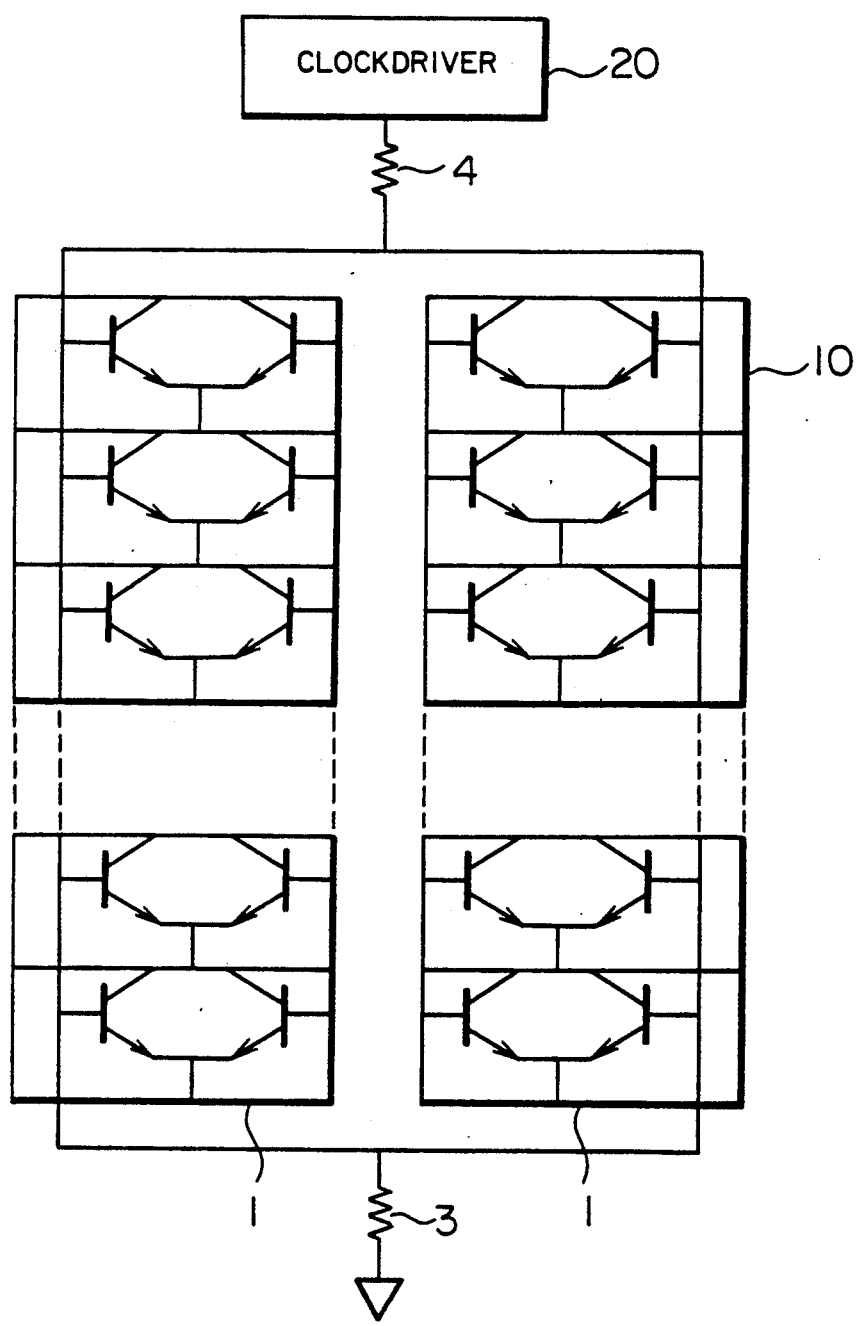
FIG. 2 is a schematic diagram showing another embodiment of a flash analog-digital converter according to the present invention.

FIG. 2 shows another embodiment of a flash analog-digital converter according to the present invention. In the present embodiment, $2^n$ comparators applied with reference levels 1 to $2^n$ make up the comparator group 1 and are arranged in two columns. The clock signal from the clock driver 20 is sent to two columns in the manner shown in FIG. 2. The characteristic impedance $Z_0$ of the clock line for a case where the comparators are arranged in two columns, is one half the characteristic impedance of the clock line for a case where the comparators are arranged in one column. That is, the characteristic impedance $Z_0$ is equal to $(\frac{1}{2})(\sqrt{L/C})$. Accordingly, the resistance of the terminating resistor 3 is made equal to $Z_0(=\sqrt{L/C}/2)$. Incidentally, the resistor 4 is used for making the output impedance of the clock driver 20 equal to the characteristic impedance $Z_0(=\sqrt{L/C}/2)$. In a case where the clock driver 20 has small output impedance, the resistance of the resistor 4 is made equal to the above characteristic impedance $Z_0$.

Figure 3:
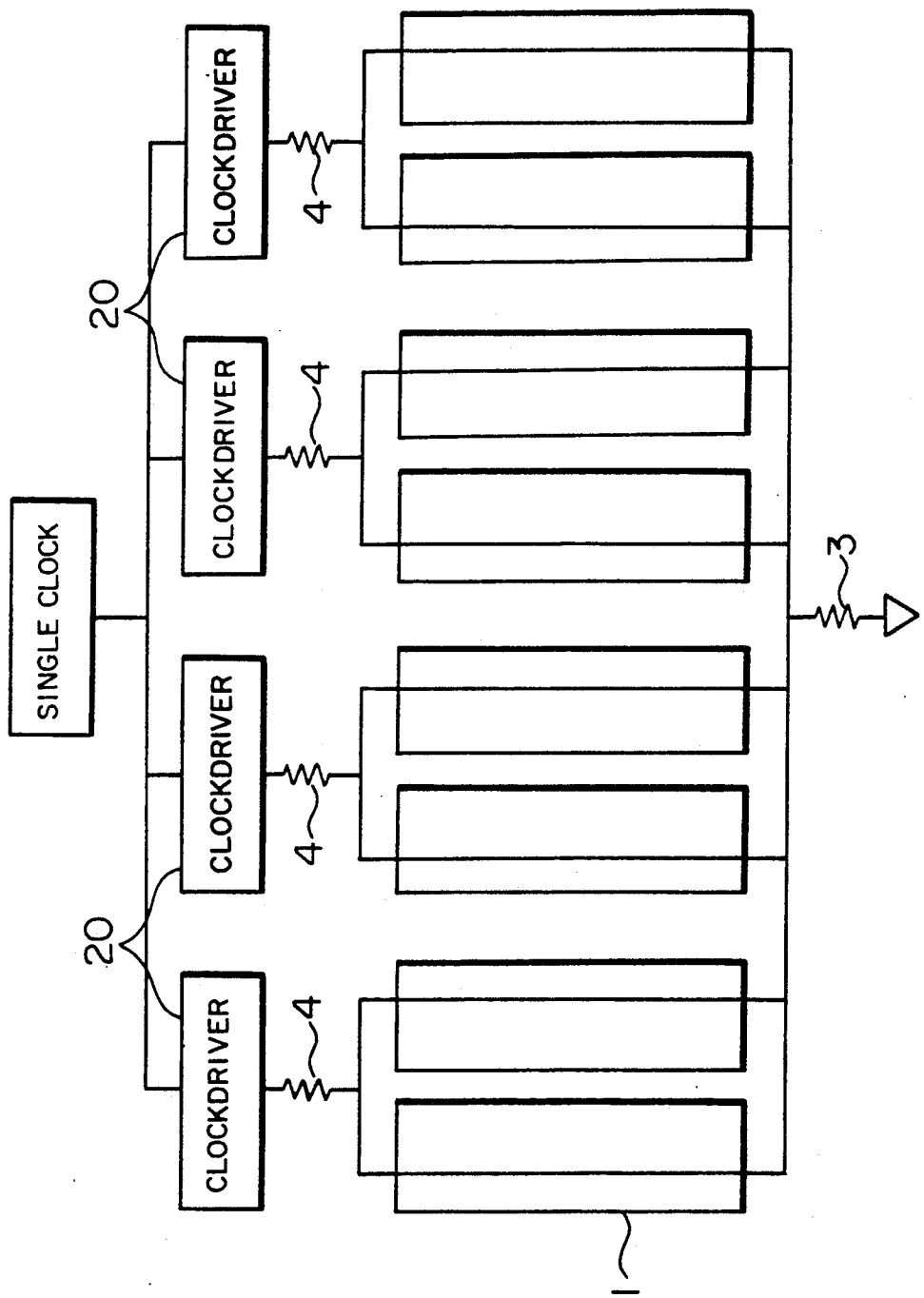
FIG. 3 is a block diagram showing a further embodiment of a flash analog-digital converter according to the present invention.

FIG. 3 shows a further embodiment of a flash analog-digital converter according to the present invention. In the present embodiment, the number of bits of the digital output is increased, so that a vast number of comparators used are divided into a plurality of comparator groups 1. The comparator groups are arranged as shown in FIG. 3. Referring to FIG. 3, a clock signal from a single clock 2 is supplied to four clock drivers 20, each of which sents out the clock signal to one comparator group 1. In this case, the terminating resistor 3 may be provided for each comparator group as shown in FIG. 1. However, when a phase difference is generated between the clock signal for one of two adjacent comparator groups and the clock signal for the other comparator group, the clock jitter is generated, and the accuracy of an analog-digital conversion is degraded. In view of the above fact, in the present embodiment, clock lines for the comparator groups are connected to one another, and then connected to one terminating resistor 3. When the number of comparator groups is expressed by N and the characteristic impedance of the clock line for one comparator group is expressed by $Z_0$, the resistance of the terminating resistor 3 is made equal to $Z_0/N$. Thus, there is no fear of generating the clock jitter. That is, the present embodiment can provide an accurate converter.

Figure 4:
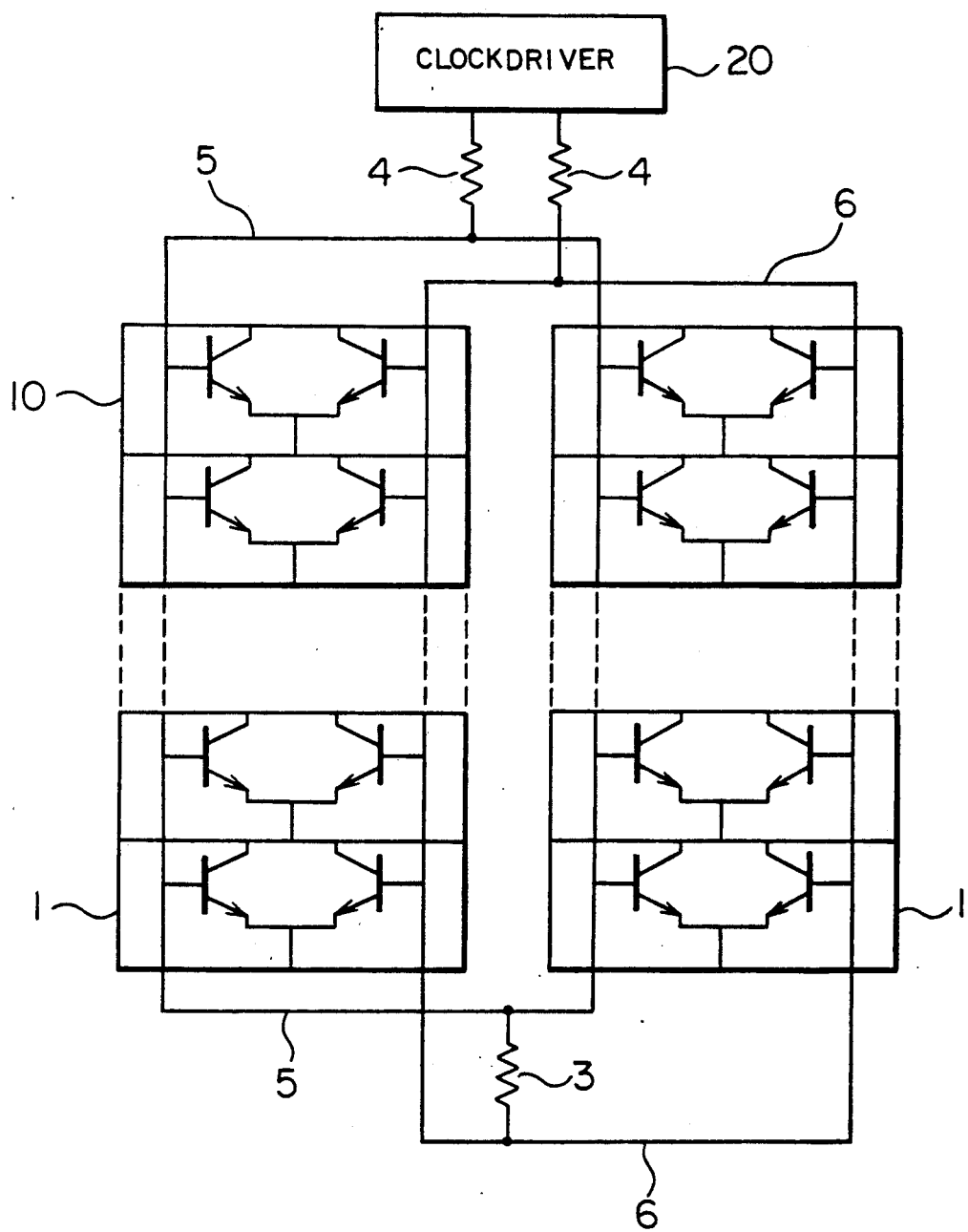
FIG. 4 is a schematic diagram showing still another embodiment of a flash analog-digital converter according to the present invention.
Figure 5:
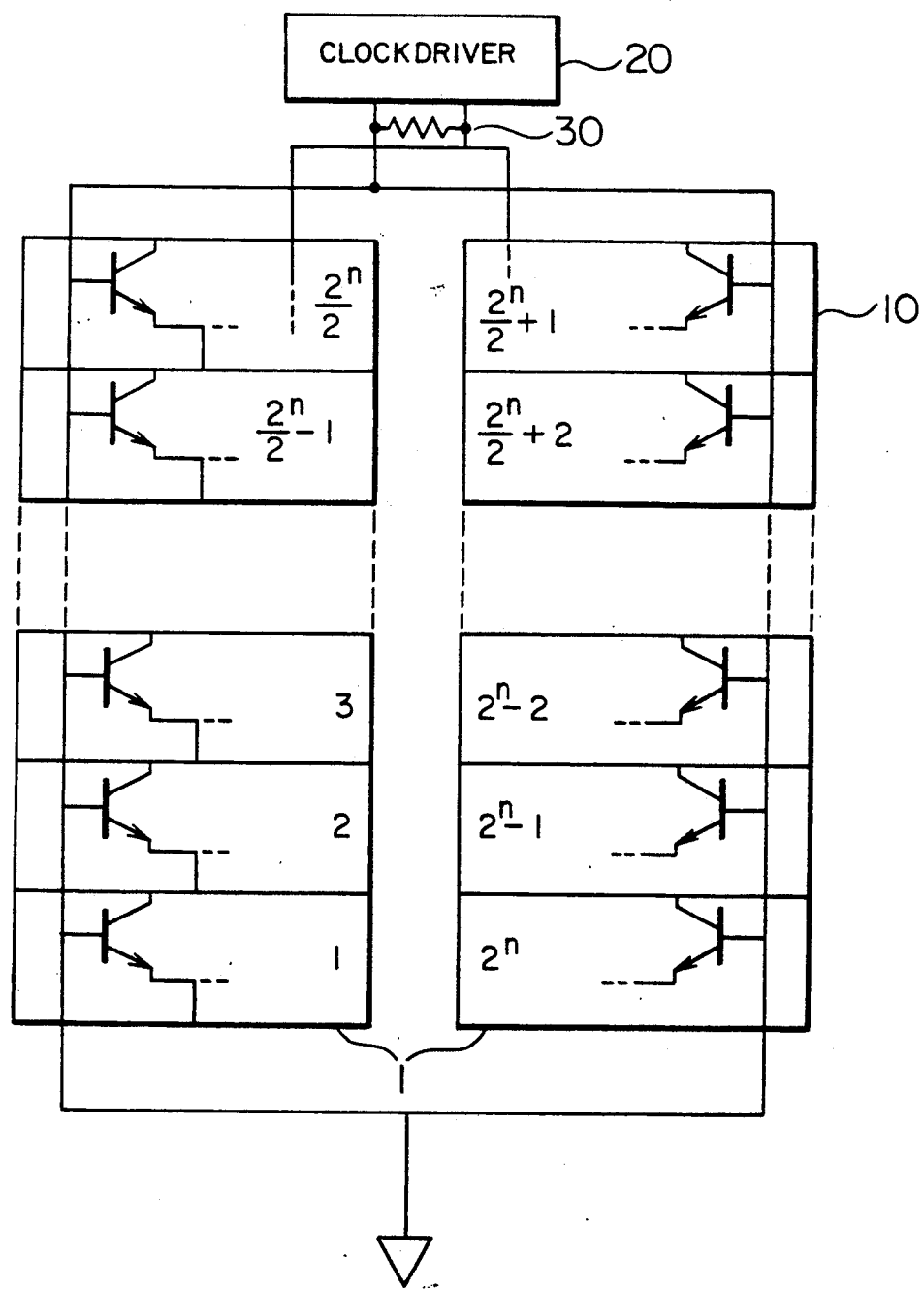
FIG. 5 is a schematic diagram showing a conventional flash analog-digital converter.
Figure 6:
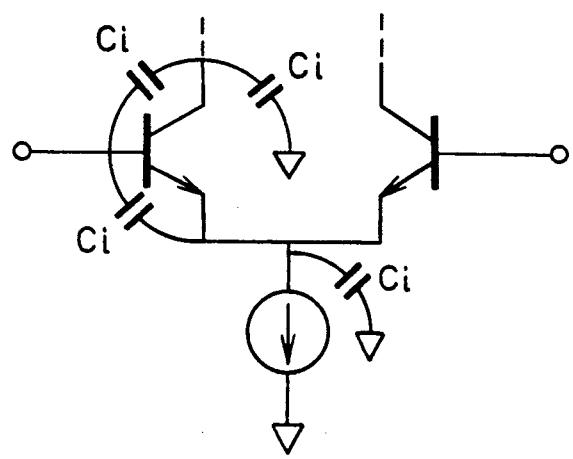
FIG. 6 is a circuit diagram showing the clock receiving part of each of comparators included in a flash analog-digital converter.
Figure 7:
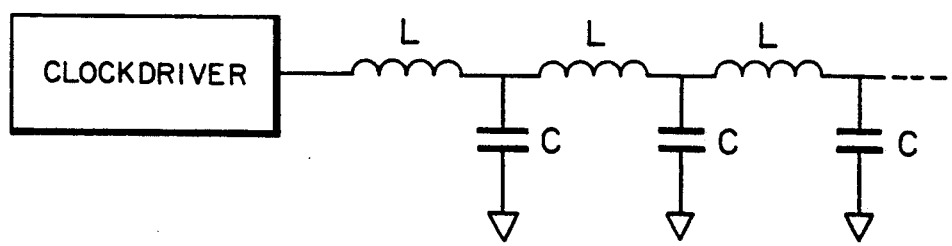
FIG. 7 shows an equivalent circuit of the clock line connected between a clock driver and the clock receiving part of each comparator of a flash analog-digital converter.

FIG. 4 shows still another embodiment of a flash analog-digital converter according to the present invention. In many cases where a high-speed clock signal is supplied to desired circuits, a complementary signal is used as the clock signal. In the present embodiment, a complementary clock signal is applied to the comparator group 1. That is, a clock signal CLK is sent by a clock line 5, and another clock signal $\overline{CLK}$ is sent by a clock line 6. Each of the clock lines 5 and 6 may be terminated by a resistor having resistance equal to the characteristic impedance $Z_0$. In the present embodiment, however, the resistor 3 having resistance equal to $2Z_0$ is connected between the ends of the clock lines 5 and 6, as shown in FIG. 6. In this case, no D.C. current flows out from the clock driver 20, and hence power dissipation is reduced. Further, the clock lines 5 and 6 are disposed on an integrated circuit chip in parallel to each other. Hence, the resistor 3 can be formed between the clock lines 5 and 6 at a position which is near the bottom of the comparator group 1. That is, the resistor 3 can be formed without increasing the size of the integrated circuit chip.

In the above, explanation has been made of four embodiments of a flash analog-digital converter according to the present invention. However, the present invention is not limited to an analog-digital converter, but is applicable to any of integrated circuits, in which a plurality of circuits having the same input impedance are arranged at regular intervals, and a signal from a signal source is applied to input portions of all the circuits.

As has been explained in the foregoing, according to the present invention, there is provided an integrated circuit, in which a signal line is terminated by a resistor which has resistance equal to the characteristic impedance of the signal line determined from a lay-out design, at a position near the bottom of a circuit group such as a comparator group, to prevent ringing in a signal applied to each of circuits making up the circuit group such as a clock signal, thereby operating each circuit such as a comparator normally. Specifically, when the present invention is applied to a flash analog-digital converter, the converter can perform a stable operation even for a high-speed clock signal.

We claim:

1. An integrated circuit including a plurality of circuits each having the same input impedance and connected to a signal line at predetermined intervals, the input impedance being substantially capacitive, input parts of the circuits being applied with a signal from a single signal source, the integrated circuit comprising:

a plurality of said signal lines connected to the single signal source for sending the signal to the input parts of the circuits, the characteristic impedance of each of the signal lines being given by $Z_0 = \sqrt{L/C}$, where L indicates the inductance of the signal line per one circuit and C indicates the combined capacitance of the parasitic capacitance of the signal line per one circuit and the input capacitance of each circuit; and terminating means comprising a common resistor coupled to said signal lines, wherein an output impedance of the single signal source is selected to be the characteristic impedance $Z_0$ per one signal line.

2. An integrated circuit including a plurality of circuits having the same input impedance and arranged at predetermined intervals, the input impedance being substantially capacitive, input parts of the circuits being applied with a signal from a single signal source, the integrated circuit comprising:

a pair of signal lines connected to the single signal source for sending the signal to the input parts of the circuits, the characteristic impedance of each of the signal lines being given by $Z_0 = \sqrt{L/C}$ where L indicates the inductance of the signal line per one circuit and C indicates the combined capacitance of the parasitic capacitance of the signal line per one circuit and the input capacitance of each circuit, wherein an output impedance of the single signal source is selected to be the characteristic impedance $Z_0$, and wherein the single signal source provides complementary signals to each of said circuits by said pair of signal lines, and wherein the integrated circuit further comprises a resistor serving as a terminating means connected between the pair of signal lines wherein the resistor has an impedance equal to $2 Z_0$.

3. An integrated circuit including a signal source and a plurality of columns, each including a plurality of unit circuits, arranged at predetermined intervals, said unit circuits to be applied with a signal from said signal source and each respectively having a capacitive input impedance of substantially the same value, the integrated circuit comprising;

a signal line network including a first common node connected to said signal source, a second common node and a plurality of signal lines connected between said first common node and said second common node, each of said signal lines being respectively connected to said unit circuits on one of said columns, the characteristic impedance of each of said signal lines being given by $Z_0 = \sqrt{L/C}$, where L indicates the inductance of each of said signal lines per one unit circuit and C indicates the combined capacitance of the parasitic capacitance of each of said signal lines per one unit circuit and the input capacitance of each of said unit circuits; and terminating means having an impedance substantially equal to $Z_0/N$, where N indicates the number of said signal lines, for terminating said signal lines at said second common node, wherein an output impedance of said signal source is selected to have a value substantially equal to said characteristic impedance $Z_0$ per one signal line.

4. An integrated circuit according to claim 3, wherein the signal source is a clock driver.

5. An integrated circuit according to claim 3, wherein said unit circuits are arranged at regular intervals.

6. An integrated circuit including a signal source generating a pair of complementary signals and a plurality of unit circuits arranged at predetermined intervals, each having a pair of complementary input terminals to be respectively applied with said complementary signals from said signal source, each of said complementary input terminals of said unit circuits respectively having a capacitive input impedance of substantially the same value, the integrated circuit comprising:

first signal lines connected to said signal source at a first end thereof to receive one of said complementary signals and connected to one of said input terminals of each unit circuit and a second signal line connected to said signal source at a first end thereof to receive the other of said complementary signals and connected to the other of said input terminals of each unit circuit, the characteristic impedance of each of said first and second signal lines being given by $Z_0 = \sqrt{L/C}$, where L indicates the inductance of each of said first and second signal lines per one unit circuit and C indicates the combined capacitance of the parasitic capacitance of each of said first and second signal lines per one unit circuit and the input capacitance of each of said input terminals of said unit circuits; and terminating means connected between second ends of said first and second signal lines, said terminating means having an impedance substantially equal to $2 Z_0$, wherein an output impedance of said signal source is selected to have a value substantially equal to said characteristic impedance $Z_0$.

7. An integrated circuit according to claim 6, wherein the signal source is a clock driver generating a pair of complementary clock signals.

8. An integrated circuit according to claim 6, wherein said unit circuits are arranged at regular intervals.

9. An integrated circuit including a signal source generating a pair of complementary signals and a plurality of columns, each including a plurality of unit circuits, arranged at predetermined intervals, each unit circuit having a pair of complementary input terminals arranged so that one of said input terminals will receive one of the pair of complementary signals and the other of said input terminals will receive the other of said pair of complementary signals from said signal source, each of said complementary input terminals of said unit circuits respectively having a capacitive input impedance of substantially the same value, the integrated circuit comprising:

a signal line network including a first pair of common nodes, one of which is connected to said signal source to receive said one of said pair of complementary signals and the other of which is connected to said signal source to receive the other of said pair of complementary signals, a second pair of common nodes, and a plurality of signal lines connected between said first pair of common nodes and said second pair of common nodes, each of said signal lines being connected to said unit circuits on one of said columns so as to apply said pair of complementary signals to said pairs of complementary input terminals of said unit circuits, respectively, the characteristic impedance of each of said signal lines being given by $Z_0=\sqrt{L/C}$, where L indicates the inductance of each of said signal lines per one unit circuit and C indicates the combined capacitance of parasitic capacitance of each of said signal lines per one unit circuit and the input capacitance of each of said input terminals of said unit circuits; and terminating means connected between said second pair of common nodes, wherein an output impedance of said signal source is selected to the value substantially equal to said characteristic impedance $Z_0$ per one signal line.

10. An integrated circuit according to claim 9, wherein said terminating means has an impedance substantially equal to 2 $Z_0$.

11. An integrated circuit according to claim 9, wherein the output impedance of said signal source is set by a first impedance means connected between the signal source and one of the first pair of common nodes and a second impedance means connected between the signal source and the other of the first pair of common nodes.

12. An integrated circuit according to claim 11, wherein said terminating means has an impedance substantially equal to 2 $Z_0$.

13. An integrated circuit according to claim 9, wherein the signal source is a clock driver generating a pair of complementary clock signals.

14. An integrated circuit according to claim 12, wherein the signal source is a clock driver generating a pair of complementary clock signals.

15. An integrated circuit according to claim 9, wherein said unit circuits are arranged at regular intervals.

16. An analog/digital converter including a plurality of comparators having the same input impedance and arranged at predetermined intervals, the input impedance being substantially capacitive, input parts of the comparators being applied with a clock signal from a single clock signal source, the analog/digital converter comprising:

at least one clock signal line connected to the single clock signal source for sending the clock signal to the input parts of the comparators, the characteristic impedance of the clock signal line being given by $Z_0=\sqrt{L/C}$ where L indicates the inductance of the clock signal line per one comparator and C indicates the combined capacitance of the parasitic capacitance of the clock signal line per one comparator and the input capacitance of each comparator; and terminating means having an impedance equal to the characteristic impedance $Z_0$ for terminating the clock signal line, wherein an output impedance of the single signal source is selected to be the characteristic impedance $Z_0$.

17. An analog/digital converter including a clock signal source and a plurality of columns, each including a plurality of comparators, arranged at predetermined intervals, said comparators to be applied with a clock signal from said clock signal source and each respectively having a capacitive input impedance of substantially the same value, the analog/digital converter comprising:

a clock signal line network including a first common node connected to said clock signal source, a second common node and a plurality of clock signal lines connected between said first common node and said second common node, each of said clock signal lines being respectively connected to said comparators on one of said columns, the characteristic impedance of each of said clock signal lines being given by $Z_0=\sqrt{L/C}$, where L indicates the inductance of each of said clock signal lines per one comparator and C indicates the combined capacitance of the parasitic capacitance of each of said clock signal lines per one comparator and the input capacitance of each of said comparators; and terminating means having an impedance substantially equal to $Z_0/N$, where N indicates the number of said clock signal lines, for terminating said clock signal lines at said second common node, wherein an output impedance of said clock signal source is selected to have a value substantially equal to said characteristic impedance $Z_0$ per one signal line.

18. An analog/digital converter including a clock signal source generating a pair of complementary clock signals and a plurality of columns, each including a plurality of comparators, arranged at predetermined intervals, each comparator having a pair of complementary input terminals arranged so that one of said input terminals will receive one of the pair of complementary clock signals and the other of said input terminals will receive the other of said pair of complementary clock signals from said clock signal source, each of said complementary input terminals of said comparators respectively having a capacitive input impedance of substantially the same value, the analog/digital converter comprising:

a clock signal line network including a first pair of common nodes, one of which is connected to said clock signal source to receive said one of said pair of complementary clock signals and the other of which is connected to said clock signal source to receive the other of said pair of complementary clock signals, a second pair of common nodes, and a plurality of clock signal lines connected between said first pair of common nodes and said second pair of common nodes, each of said clock signal lines being connected to said comparators on one of said columns so as to apply said pair of complementary clock signals to said pairs of complementary input terminals of said comparators, respectively, the characteristic impedance of each of said clock signal lines being given by $Z_0=\sqrt{L/C}$, where L indicates the inductance of each of said clock signal lines per one comparator and C indicates the combined capacitance of parasitic capacitance of each of said clock signal lines per one comparator and the input capacitance of each of said input terminals of said comparators; and terminating means connected between said second pair of common nodes, wherein an output impedance of said clock signal source is selected to the value substantially equal to said characteristic impedance $Z_0$ per one signal line.

19. An analog/digital converter according to claim 18, wherein said terminating means has an impedance substantially equal to 2 $Z_0$.

20. An analog/digital converter according to claim 18, wherein the output impedance of said signal source is set by a first impedance means connected between the signal source and one of the first pair of common nodes and a second impedance means connected between the signal source and the other of the first pair of common nodes.

21. An analog/digital converter according to claim 18, wherein said unit circuits are arranged at regular intervals.

* * * * *